United States Patent [19]

Lommers

[11] Patent Number: 4,736,458
[45] Date of Patent: Apr. 5, 1988

[54] RECEIVER PROVIDED WITH AN AUTOMATIC FREQUENCY CONTROL LOOP

[75] Inventor: Anthonius J. J. C. Lommers, Eindhoven, Netherlands

[73] Assignee: U. S. Philips Corporation, New York, N.Y.

[21] Appl. No.: 926,477

[22] Filed: Nov. 3, 1986

[30] Foreign Application Priority Data

Nov. 27, 1985 [NL] Netherlands ............... 8503274

[51] Int. Cl.$^4$ .................... H03J 1/16; H03L 7/00
[52] U.S. Cl. .................... 455/192; 455/259; 455/261; 455/264; 331/36 C
[58] Field of Search ............... 455/255, 256, 258, 264, 455/182, 164, 192, 195, 173, 259; 331/36 R, 36 C

[56] References Cited

U.S. PATENT DOCUMENTS

| | | | |
|---|---|---|---|
| 3,007,043 | 10/1961 | Rennenkampf | 455/258 |
| 3,697,885 | 10/1972 | Avins et al. | 455/192 |
| 3,764,917 | 10/1973 | Rhee | 455/264 |
| 3,784,917 | 1/1974 | Kenyon | 455/192 |
| 3,991,371 | 11/1976 | Shelby | 455/192 |
| 4,271,533 | 6/1981 | Hand et al. | 455/264 |
| 4,523,151 | 6/1985 | Bauerschmidt | 331/36 C |

Primary Examiner—Robert L. Griffin
Assistant Examiner—Curtis Kuntz
Attorney, Agent, or Firm—Marianne R. Rich

[57] ABSTRACT

Receiver (1–9) provided with a frequency control loop (2–6) for automatic fine tuning, consecutively incorporating a controllable oscillator (6) which is tunable in frequency by means of a variable capacitance diode (D), a mixer stage (2) to which the signal from the controllable oscillator (6) is applied for converting an RF receiver signal into an intermediate frequency signal, a frequency voltage converter (4) tuned to a fixed intermediate frequency for converting frequency deviations of the intermediate frequency signal relative to the fixed intermediate frequency into amplitude variations of the frequency voltage converter (4) output signal relative to a refrence value, a control signal generating circuit (5) for deriving a control signal for the variable capacitance diode (D) of the controllable oscillator (6) from the output signal of the frequency voltage converter (4), which at least partly compensates the asymmetrical diode capacitance-voltage characteristic. In order to prevent unwanted side-tuning effects from occuring during this compensation, the frequency-dependent variation of the control signal for the variable capacitance diode (D) is to assume an asymmetrical S curve which is curved around the maximum values therein and which compensates the asymmetry in the diode capacitance variation.

6 Claims, 2 Drawing Sheets

RECEIVER PROVIDED WITH AN AUTOMATIC FREQUENCY CONTROL LOOP

BACKGROUND OF THE INVENTION

1. Field of the Invention

The invention relates to a receiver provided with a frequency control loop for automatic fine tuning, consecutively incorporating a controllable oscillator which is tunable in frequency by means of a variable capacitance diode, a mixer stage to which the signal from the controllable oscillator is applied for converting an RF receiver signal into an IF signal, a frequency voltage converter tuned to a fixed intermediate frequency for converting frequency deviations of the IF signal relative to the fixed intermediate frequency into amplitude variations of the frequency voltage converter output signal relative to a reference value, a control signal generating circuit for deriving a control signal for the variable capacitance diode of the controllable oscillator from the output signal of the frequency voltage converter, said controllable oscillator at least partly compensating its asymmetrical capacitance-voltage characteristic.

2. Description of the Prior Art

A frequency control loop for automatic fine tuning for use in a receiver of this type is known from the published German Patent Application No. 1,260.558.

The control signal generating circuit of the known frequency control loop comprises a transistor which amplifies on the one hand the output voltage of a frequency discriminator functioning as a frequency voltage converter in order to increase the control slope and on the other hand drives the variable capacitance diode in such a manner that its capacitance varies linearly with the said frequency deviations of the IF signal in the case of normally occurring field strengths.

This variation is achieved in the known frequency control loop by operating and choosing the operating point of the transistor such that positive and negative frequency deviations for normally occurring field strengths result in an amplitude limitation of the control signal supplied by the transistor at first and second fixed values, respectively, which are located asymmetrically around the said reference value corresponding to the intermediate frequency. Under certain circumstances the asymmetry thus obtained in the control signal compensates the asymmetry of the capacitance voltage characteristic of the variable capacitance diode of the controllable oscillator. As a result the capture and hold range of the frequency control loop, hereinafter breifly referred to as the control range, is to a certain extent located symmetrically around the correct tuning point, that is to say, the tuning position at which the carrier of the IF signal coincides with the said fixed intermediate frequency.

In the tuning ranges where amplitude limitation of the control signal occurs, the control signal does not vary with possibly occurring frequency deviations of the If signal and the automatic fine tuning is therefore not operative. Consequently a stable tuning position on the edges of the RF filter of the receiver preceding the frequency-voltage converter, also referred to as side tuning, becomes possible. This results in a considerably audible signal distortion.

In addition a linear amplification of the principally symmetrical discriminator voltage is effected for small field strengths in the transistor of the known frequency control loop so that also the control signal is symmetrical. The asymmetrical capacitance voltage characteristic of the variable capacitance diode is then not compensated so that also the control range of the known frequency control loop is asymmetrical.

SUMMARY OF THE INVENTION

It is an object of the invention to symmetrize the control range of a frequency control loop for automatic fine-tuning in a receiver relative to the correct tuning point independently of the field strength and without the possible occurrence of the undesired stable side-tuning effects.

According to the invention a receiver of the type described in the opening paragraph is characterized in that the control signal generating circuit comprises a threshold attenuation circuit arranged between the frequency voltage converter and the variable capacitance diode, the threshold voltage of said attenuation circuit mainly corresponding to the said reference value and its transfer factor decreasing by a substantially constant and finite dB value when the frequency voltage converter output signal exceeds the threshold voltage.

The invention is based on the recognition that for an asymmetrical amplitude adaptation of the control signal for compensating the asymmetrical capacitance-voltage characteristic of the variable capacitance diode amplitude limitation of the control signal and hence the occurrence of stable side-tuning effects is prevented by linearly amplifying or attenuating the frequency voltage converter output signal above the reference value relative to the output signal below the reference value.

When the measure according to the invention is used, the control signal has a positive or negative amplitude variation dependent on the direction of the frequency deviation relative to the reference value the variation initially increasing gradually to a given maximum positive or negative value with the value of the frequency deviation and thereafter decreasing gradually. The maximum positive and the maximum negative amplitude variations of the control signal are inversely proportional to the capacitance deviations of the variable capacitance diode relative to a reference capacitance corresponding to the reference value, caused by these amplitude deviations. In addition these maximum positive and negative amplitude deviations each mainly occur only in one given positive or negative frequency deviation relative to the correct tuning point, or in other words: the frequency-dependent amplitude variation of the control signal is curved in the vicinity of these maximum amplitude deviations so that stable side-tuning effects are prevented and the symmetrisation obtained is independent of the amplitude of the IF signal or the field strength.

A preferred embodiment of a receiver according to the invention, which can easily be realised, is characterized in that the threshold attenuation circuit comprises a voltage comparator for comparing the frequency voltage converter output voltage with the threshold voltage, and a voltage divider coupled to the voltage comparator and arranged between the frequency voltage converter and the variable capacitance diode, said voltage comparator increasing the dividing factor of the voltage divider when the last-mentioned output voltage exceeds the threshold voltage.

In a further preferred embodiment, which is characterized in that the voltage divider comprises a series arrangement of first and second resistors, which first resistor is also coupled between the frequency voltage converter and the variable capacitance diode and which second resistor is coupled to the emitter of a first transistor incorporated in the voltage comparator, said first transistor being connected to ground via its collector and to a first bias voltage via the base, said first bias voltage being substantially equal to the difference between the threshold voltage and the voltage across the base-emitter junction of the first conducting transistor, the first transistor realises a comparison function and also controls the dividing factor of the potential divider.

Still another preferred embodiment of a receiver of this type is characterized in that the first resistor constitutes a further voltage divider with a third resistor and is coupled via this third resistor to the emitter of a second transistor, which second transistor is of a conductivity type opposite to that of the first transistor and is connected via its collector to a supply voltage and via its base to a second bias voltage, said second bias voltage being substantially equal to the sum of the threshold voltage and the voltage across the baseemitter junction of the second conducting transistor, the ratio between the dividing factor of the firstmentioned voltage divider and that of the further voltage divider being opposed to the asymmetry of the capacitancevoltage characteristic of the variable capacitance diode relative to a reference capacitance corresponding to the reference value.

When this measure is used a bilateral asymmetrical amplitude adaptation of the control signal is obtained.

BRIEF DESCRIPTION OF THE DRAWINGS

The invention will be further described by way of example with reference to the accompanying Figures shown in the drawing.

In this drawing.

DESCRIPTION OF THE PREFERRED EMBODIMENT

Figure 1:
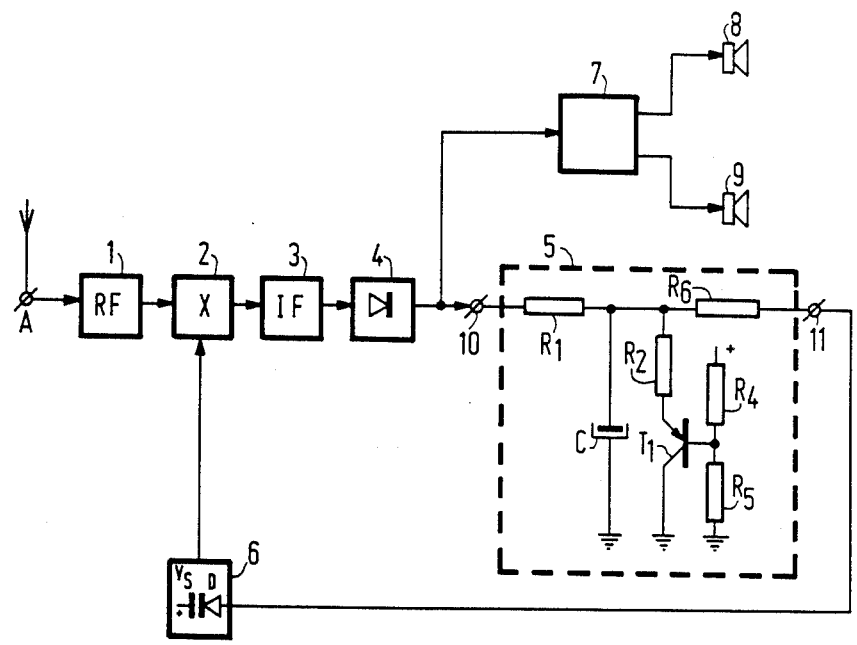
FIG. 1 shows a receiver according to the invention.

FIG. 1 shows a receiver 1-9 according to the invention comprising an RF input stage 1 provided with an aerial input A, which stage is coupled to a frequency control loop 2-6 and through this loop to a signal processing unit 7 (for example, a stereo decoder and/or audio output stages) and loudspeakers 8 and 9. The frequency control loop 2-6 incorporates: a mixer stage 2 coupled to the RF input stage 1, an intermediate frequency (IF) part 3, a frequency-voltage converter 4 which may be, for example, an FM quadrature detector, FM-PLL-detector, ratio detector, etc., a control signal generating circuit 5 which is coupled to a variable capacitance diode D which diode D is a tuning element of a controllable oscillator 6, which oscillator 6 applies a frequency-tunable oscillator signal to the mixer stage 2.

Signal processing in such a receiver is known per se: a radio frequency (RF) receiver signal is applied via the RF input stage 1 to the mixer stage 2 wherein this RF signal is converted with the aid of the oscillator signal into an intermedaite frequency (IF) signal. Selection of the IF signal is effected in the IF part 3. In the case of an FM receiver frequency detection is subsequently effected in the frequency voltage converter 4, succeeded by signal processing (for example, stereo decoding) in a signal processing unit 7 coupled thereto and reproduction by means of the loudspeakers 8 and 9. In the case of an AM receiver an AM detection is effected in an AM detector (not shown) at the output of the IF part 3, succeeded by further audio signal processing in an audio output stage (likewise not shown).

The IF part 3 and the frequency voltage converter 4 are mutually tuned to the same fixed intermediate frequency. In both FM and AM receivers the frequency voltage converter 4 converts frequency deviations of the carrier of the IF signal relative to the fixed intermediate frequency into signal amplitude variations relative to a reference value corresponding to the fixed intermediate frequency, which variations are determined in magnitude and direction by these frequency deviations. Automatic fine tuning is achieved by deriving in the manner to be described hereinafter a control signal for the variable capacitance diode D from the output signal of the frequency voltage converter 4—hereinafter briefly referred to as detector voltage—in the control signal generating circuit 5, which control signal controls the frequency of the controllable oscillator 6 in such a manner that a negative feedback and hence a reduction of said frequency deviations in the frequency control loop 2-6 is produced.

Since the detector output voltage for positive and negative frequency deviations of equal magnitude varies symmetrically relative to the reference value, while the voltage-capacitance characteristic of the variable capacitance diode D relative to this reference value is considerably asymmetrical, the control range, in the case of a control signal varying symmetrically with the frequency around this reference value, will also be asymmetrical. To illustrate this, reference is made to FIG. 2 in which curve $K_1$ shows the last-mentioned diode characteristic (diode capacitance $C_d$ as a function of the diode out off voltage $V_D$) and curve $K_2$ shows the frequency-dependent amplitude variation of said symmetrical detector voltage or at least the DC component thereof varying in amplitude with the frequency deviations.

Starting from a reference capacitance $C_r$ at a diode cut-off voltage $V_D = V_s - V_r$ wherein $V_s$ is the supply voltage applied to the cathode of the diode D and $V_r$ is the reference value, occurring in the case of correct tuning, when the carrier of the IF signal coincides with the fixed intermediate frequency, a control signal $V_C$ corresponding to the d.c. component of the detector voltage and varying symmetrically over $K_2$ around $V_r$ between $V_r + \Delta V$ and $V_r - \Delta V$ will result in a capacitance variation in a range which is located asymmetrically around $C_r$ between maximum and minimum capacitance values $C_1$ and $C_2$ the range between $C_1$ and $C_r$ being considerably larger than that between $C_r$ and $C_2$|. By reducing the maximum, in this case positive amplitude (Q) of the control signal $V_c$, occurring at the frequency $f_2$, relative to the maximum negative amplitude (S) occurring at the frequency $f_1$, for example, up to $V_r + \frac{1}{2}\Delta V$, the maximum capacitance value $C_1$ can be reduced to $C_3$, the capacitance difference between to $C_3$ and $C_r$ then being substantially equal to that between $C_r$ and $C_2$. The loop gain of the frequency control loop 2-6 is then equal for positive frequency deviations to that for negative frequency deviations resulting in a symmetrical control range.

Figure 2:
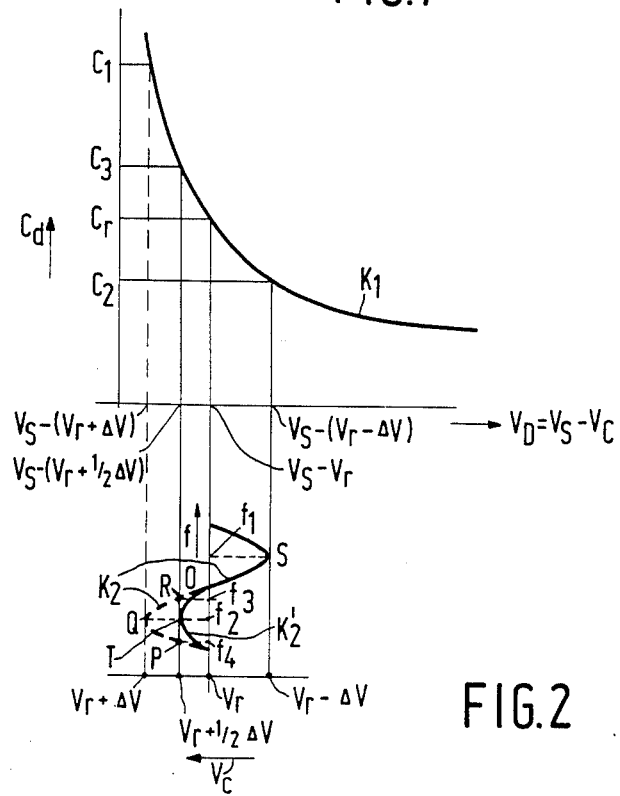
FIG. 2 shows the capacitance-voltage characteristic of the variable capacitance diode incorporated in the controllable oscillator, as well as some characteristics of the control signal to illustrate the operation of the invention.

When such an amplitude reduction is obtained by an amplitude limitation of the control signal $V_C$, as in the prior art and as is shown by the flat portion between the points R and P in FIG. 2, an undesired side-tuning may be produced in the range between said frequency $f_2$ and a frequency $f_4$ corresponding to the point P.

In the receiver according to the invention such an amplitude limitation of the control signal $V_C$ is prevented in the amplitude reduction by attenuating the control signal by a constant and finite dB value (in the given case 3 dB) for values which are exceeding $V_r$, relative to values lower than $V_r$. Consequently the curvature around point T, which corresponds in frequency to point Q, is maintained. in the ranges outside $f_1$ and $f_2$ there is therefore a positive feedback of frequency deviations in the frequency control loop resulting in an instability which prevents the occurrence of stable side-tuning effects.

Such an amplitude reduction which is direction-dependent relative to the reference value $V_r$ is obtained with the control signal generating circuit 5 of the receiver of FIG. 1. It comprises a voltage divider $R_1$, $R_2$, which is coupled at one end via an input terminal 10 to the output of the frequency voltage converter 4 and at the other end to the emitter of a first PNP transistor $T_1$. The base of this transistor $T_1$ is connected to a first bias voltage and its collector is connected to ground. The first bias voltage is obtained at an output of a voltage divider $R_4$, $R_5$ arranged between the supply voltage $V_S$ and ground. The junction between resistors $R_1$ and $R_2$ of the voltage divider $R_1$, $R_2$ is connected to ground for signal frequencies via an earthed capacitor C and coupled via a resistor $R_6$ and an output 11 of the control signal generating circuit 5 to the variable capacitance diode D.

The first bias voltage is adjusted to a value via the voltage divider $R_4$, $R_5$, which value is lower than the reference value $V_r$ of the detector voltage by mainly one diode voltage (approximately 600 mV) i.e. the voltage across the base-emitter diode of the transistor $T_1$ in the conducting state. The threshold voltage of the voltage divider $R_1R_2$ and transistor $T_1$ functioning as a threshold attenuation circuit is therefore equal to the reference value $V_r$: for detector voltages above the reference voltage $V_r$ (broken line portion O, P, Q, R of curve $K_2$) transistor $T_1$ is conducting, the resistor $R_2$ being connected to ground through the emitter-collector path of $T_1$ and the detector voltage being attenuated by the dividing factor of the voltage divider $R_1R_1$. The frequency-dependent control voltage $V_C$ then follows the solid line portion of the curve $K_2'$ via point T.

When the detector voltage decreases to below the reference value $V_r$, the conduction of transistor $T_1$ decreases. Although the voltage divider $R_1R_2$ is still operative to some extent in this range, the attenuation effect is negligibly small in practice and the frequency-dependent control voltage $V_C$ mainly follows the solid line portion of curve $K_2$ via the point S.

An amplitude adaptation of the detector voltage to the asymmetrical diode characteristic for value above and below the reference value $V_r$ is possible with the control signal generating circuits of FIGS. 3 and 4 in which elements corresponding to those of FIG. 1 have the same reference numerals. This so-called bilateral amplitude adaptation is achieved in the circuit of FIG. 3 by incorporating, in addition to the threshold first PNP transistor $T_1$, a threshold second NPN transistor $T_2$ whose emitter is connected via a third resistor $R_3$ to the junction between the first and second resistors $R_1$ and $R_2$, which first and third resistors $R_1$ and $R_3$ constitute a so-called further voltage divider, the collector of $T_2$ being connected to a supply voltage and the base being connected to a second bias voltage. the first and second bias voltages are obtained by a suitable voltage division of the supply voltage $V_S$ via the partial resistors $R_4'$ and $R_4''$ of the original resistor $R_4$ and the resistor $R_5$. By choosing the ratio between the dividing factor determined by $R_1$ and $R_2$ and the dividing factor determined by $R_1$ and $R_3$ to be mainly inversely proportional to the capacitance asymmetry of the diode characteristic around the reference capacitance $C_r$, a symmetrical control range is obtained in the case of suitable chosen bias voltages. The amplitude of the detector voltage variation does not need to have a given value in order to give the control signal the frequency-dependent variation through the points S and T indicated by curve $K_2'$, but it may also be larger than that of the circuit of FIG. 1.

Figure 3:
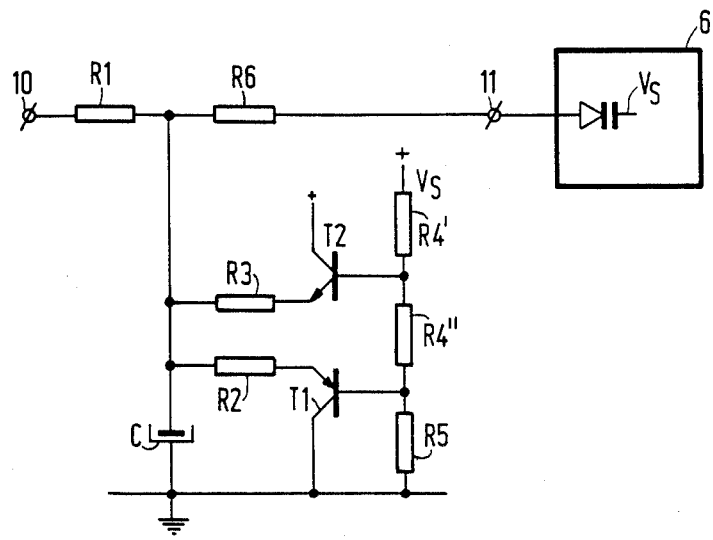
FIG. 3 shows a threshold attenuation circuit for bilateral amplitude adaptation of the control signal.
Figure 4:
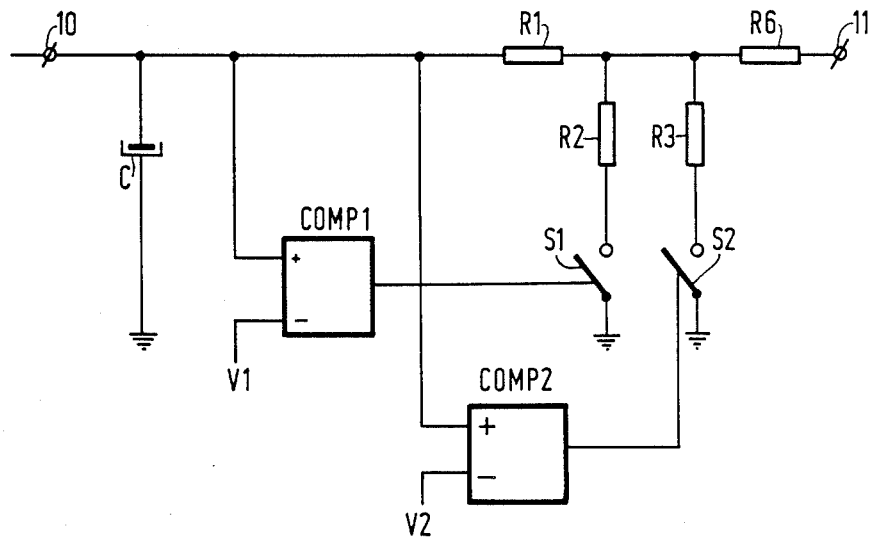
FIG. 4 shows a further, more general embodiment of a threshold attenuation circuit for use in a receiver according to the invention.

FIG. 4 shows a general embodiment of a control signal generating circuit 5 for use in a receiver according to the invention in which a voltage comparison is effected in first and second comparators COMP1 and COMP2 which upon exceeding first and second threshold voltages $V_1$ and $V_2$ close switches $S_1$ and $S_2$ and therefore produce a bilateral amplitude adaptation of the detector voltage, likewise as the circuit of FIG. 3.

In a practical embodiment the resistors $R_1$–$R_6$ had the following values: 30 K$\Omega$; 30 K$\Omega$; 60 K$\Omega$; 15 K$\Omega$; 4.3 K$\Omega$; 10 K$\Omega$, respectively, and the resistors $R_4'$ and $R_4''$ had values of 4.3 K$\Omega$ and 10.7 K$\Omega$, respectively, the supply voltage $V_S$ was 1600 mV; the reference value $V_r$ was 800 mV and the capacitor C had a value of 4.7 $\mu$F.

It is evident that the inventive idea may also be realised in different manners, for example, by using a threshold amplifier which amplifies the detector voltage at values below the reference value $V_r$ relative to those above $V_r$ by applying the control voltage $V_c$ to the cathode of the diode so that the abovedescribed amplitude adaptation is to be exactly reversed to obtain a suitable compensation of the asymmetrical diode characteristic and/or by realising a reversal in the frequency or voltage-dependent transfer function elsewhere in the circuits of the control loop 2–6.

What is claimed is:

1. A receiver provided with a frequency control loop for automatic fine tuning, consecutively incorporating a controllable oscillator which is tunable in frequency by means of a variable capacitance diode, a mixer stage to which the signal from the controllable oscillator is applied for converting an RF receiver signal into an intermediate frequency signal, a frequency voltage converter tuned to a fixed intermediate frequency for converting frequency deviations of the intermediate frequency signal relative to the fixed intermediate frequency into amplitude variations of the frequency voltage converter output signal relative to a reference value, a control signal generating circuit for deriving a control signal for the variable capacitance diode of the controllable oscillator from the output signal of the frequency voltage converter, said controllable oscillator at least partly compensating its asymmetrical capacitance-voltage characteristic, characterized in that the control signal generating circuit comprises a threshold attenuation circuit arranged between the frequency voltage converter and the variable capacitance diode, the threshold voltage of said attenuation circuit mainly corresponding to the said reference value and its transfer factor decreasing by a subtantially constant and finite dB value when the frequency voltage converter output signal exceeds the threshold voltage.

2. A receiver provided with a frequency control loop for automatic fine tuning, consecutively incorporating a controllable oscillator tunable in frequency by a variable capacitance diode, a mixer stage to which the signal from the controllable oscillator is applied for converting an RF receiver signal into an intermediate frequency signal, a frequency voltage converter tuned to a fixed intermediate frequency for converting frequency deviations of the intermediate frequency signal relative to the fixed intermediate frequency into amplitude variations of the frequency voltage converter output signal relative to a reference value, a control signal generating circuit for deriving a control signal for the variable capacitance diode of the controllable oscillator from the output signal of the frequency voltage converter, said controllable oscillator at least partly compensating its asymmetrical capacitance-voltage characteristic, characterized in that the control signal generating circuit comprises a threshold attenuation circuit arranged between the frequency voltage converter and the variable capacitance diode, the threshold voltage of said attenuation circuit mainly corresponding to said reference value and its transfer factor decreasing by a substantially constant and finite dB value when the frequency voltage converter output signal exceeds the threshold voltage, wherein said threshold attenuation circuit comprises a voltage comparator for comparing the output voltage of the frequency voltage converter with the threshold voltage, and a voltage divider coupled to the voltage comparator and arranged between the frequency voltage converter and the variable capacitance diode, said voltage comparator increasing the dividing factor of the voltage divider when the last-mentioned output voltage exceeds the threshold voltage.

3. A receiver as claimed in claim 2, characterized in that the voltage divider comprises a series arrangement of first and second resistors, which first resistor is also coupled between the frequency voltage converter and the variable capacitance diode and which second resistor is coupled to the emitter of a first transistor incorporated in the voltage comparator, said first transistor being connected to ground via its collector and to a first bias voltage via its base, said first bias voltage being mainly equal to the difference between the threshold voltage and the voltage across the base-emitter junction of the first conducting transistor.

4. A receiver as claimed in claim 3, characterized in that the first resistor constitutes a further voltage divider with a third resistor and is coupled via said third resistor to the emitter of a second transistor, which second transistor is of a conductivity type opposite to that of the first transistor and is connected via its collector to a supply voltage and via its base to a second bias voltage, said second bias voltage being substantially equal to the sum of the threshold voltage and the voltage across the base-emitter junction of the second conducting transistor, the ratio between the dividing factor of the first-mentioned voltage divider and that of the further voltage divider being opposed to the asymmetry of the capacitance-voltage characteristic of the variable capacitance.

5. Receiver apparatus, comprising:
means for receiving an RF information signal;
controllable oscillator means for generating a local RF signal, said controllable oscillator means having non-linear capacitance means having a capacitance varying in accordance with a control signal applied thereto, said local RF signal having a frequency dependent upon said capacitance of said capacitance means;
mixing means for mixing said RF information signal and said local RF signal and generating an intermediate frequency signal in response thereto;
frequency-voltage converter means connected to said mixing means for generating a converter output signal having an output amplitude corresponding to the difference between said intermediate frequency and a reference frequency; and
control signal generating means interconnected between said frequency-voltage converter means and said non-linear capacitance means for generating said control signal, said control signal generating means having a first, constant transfer factor for control signals controlling said variable capacitance means over a first capacitance range wherein said capacitance varies at a first average rate with respect to voltage applied thereto, and a second constant transfer factor less than said first transfer factor for control signals controlling said variable capacitive means of a second capacitance range wherein said capacitance varies as a second average rate greater than said first average rate.

6. Receiver apparatus as set forth in claim 5, wherein said variable capacitance means comprises a variable capacitance diode.

* * * * *